(12) United States Patent
Yun et al.

(10) Patent No.: US 10,985,337 B2
(45) Date of Patent: *Apr. 20, 2021

(54) ORGANIC LIGHT-EMITTING DIODE AND DISPLAY DEVICE COMPRISING THE SAME

(71) Applicant: LG Display Co., Ltd., Seoul (KR)

(72) Inventors: Min Yun, Suwon-si (KR); Seung Kim, Seoul (KR); HyungJune Kim, Goyang-si (KR); Jaeil Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/700,220

(22) Filed: Dec. 2, 2019

(65) Prior Publication Data
US 2020/0106037 A1    Apr. 2, 2020

Related U.S. Application Data

(63) Continuation of application No. 16/041,536, filed on Jul. 20, 2018, now Pat. No. 10,529,942.

(30) Foreign Application Priority Data

Sep. 12, 2017  (KR) .................. 10-2017-0116788

(51) Int. Cl.
*H01L 51/50*     (2006.01)
*H01L 51/52*     (2006.01)
*H01L 27/32*     (2006.01)

(52) U.S. Cl.
CPC .......... *H01L 51/504* (2013.01); *H01L 27/322* (2013.01); *H01L 27/3244* (2013.01);
(Continued)

(58) Field of Classification Search
CPC combination set(s) only.
See application file for complete search history.

(56) References Cited

U.S. PATENT DOCUMENTS

2010/0163854 A1* 7/2010 Kho ................ H01L 51/504
                                                        257/40
2014/0070196 A1   3/2014 Kim et al.
(Continued)

FOREIGN PATENT DOCUMENTS

CN    103681760 A    3/2014
CN    104953036 A    9/2015
(Continued)

*Primary Examiner* — Mamadou L Diallo
(74) *Attorney, Agent, or Firm* — Seed Intellectual Property Law Group LLP

(57) ABSTRACT

Disclosed herein are an organic light-emitting diode and an organic light-emitting display device including the same. The organic light-emitting diode includes: a first electrode; a first light emitting structure disposed on the first electrode and including a first organic emissive layer; a second light emitting structure disposed on the first light emitting structure and including a second organic emissive layer; a third light emitting structure disposed on the second light emitting structure and including a third organic emissive layer; and a second electrode on the third light emitting structure, wherein a full width at half maximum (FWHM) of a peak wavelength of light emitted from each of the first organic emissive layer and the third organic emissive layer is within a range from 26 nm to 36 nm, inclusive.

20 Claims, 4 Drawing Sheets

(52) U.S. Cl.
CPC ........ *H01L 27/3258* (2013.01); *H01L 51/508* (2013.01); *H01L 51/5024* (2013.01); *H01L 51/5064* (2013.01); *H01L 51/5206* (2013.01); *H01L 51/5209* (2013.01); *H01L 51/5225* (2013.01); *H01L 51/5275* (2013.01); *H01L 51/5278* (2013.01)

(56) References Cited

U.S. PATENT DOCUMENTS

| | | | |
|---|---|---|---|
| 2015/0280159 A1 | 10/2015 | Kim et al. | |
| 2016/0149151 A1* | 5/2016 | Kam .................. | H01L 27/3209 257/40 |
| 2017/0084875 A1* | 3/2017 | Joung ................ | H01L 27/3244 |
| 2017/0338289 A1* | 11/2017 | Seo .................... | H01L 27/3223 |
| 2018/0151630 A1* | 5/2018 | Yamaoka ............ | G09G 3/3258 |
| 2018/0175327 A1* | 6/2018 | Jang .................. | H01L 27/3258 |

FOREIGN PATENT DOCUMENTS

| | | |
|---|---|---|
| KR | 10-2010-0076813 A | 7/2010 |
| KR | 10-2015-0113308 A | 10/2015 |

* cited by examiner

ORGANIC LIGHT-EMITTING DIODE AND DISPLAY DEVICE COMPRISING THE SAME

CROSS-REFERENCE TO RELATED APPLICATIONS

This application is a continuation of U.S. patent application Ser. No. 16/041,536, filed Jul. 20, 2018, which claims the priority of Korean Patent Application No. 10-2017-0116788 filed on Sep. 12, 2017, in the Korean Intellectual Property Office, the disclosures of which applications are incorporated herein by reference.

BACKGROUND

Technical Field

The present disclosure relates to an organic light-emitting diode, and more specifically to an organic light-emitting diode with improved efficiency and lifetime, and an organic light-emitting display device including the same.

Description of the Related Art

An OLED device is capable of producing light on its own and thus does not require any additional light source, unlike a liquid-crystal display (LCD) device. Therefore, an OLED device can be made lighter and thinner than an LCD device. Further, an OLED device has advantages in that it is driven with low voltage to consume less power, and in that it represents vivid colors, has short response time, wide viewing angle and good contrast ratio (CR). For these reasons, an OLED device is currently under development as the next generation display device.

The light emitted from an organic emissive layer of an organic light-emitting display device passes through a variety of elements therein to exit. However, some of the light may fail to exit the organic light-emitting display device and may be trapped therein. This deteriorates the efficiency of light extraction of the organic light-emitting display device. In order to improve the efficiency of light extraction of organic light-emitting display devices, the microlens array (MLA) technology is being employed that extracts the light trapped in the organic light-emitting display device by out-coupling.

As such, by employing the microlens array, the intensity of each wavelength can be increased. However, as the intensity of each wavelength increases, the shoulder peak between a blue wavelength and a green wavelength increases as well. As a result, the blue emission peak shifts to a longer wavelength, such that the blue color coordinate By is increased, as disclosed in Korean Patent Application No. 10-2008-0134984, for example.

BRIEF SUMMARY

In various embodiments, the present disclosure provides an organic light-emitting diode that employs a microlens array technology and can improve the efficiency of light extraction while suppressing the blue color coordinate from increasing too much by way of applying a blue dopant capable of adjusting a full width at half maximum (FWHM) of a peak wavelength of blue light, and an organic light-emitting display device including the same.

Additionally, in various embodiments, the present disclosure provides an organic light-emitting diode that employs the microlens array technology and can improve the lifetime and color gamut by decreasing the blue color coordinate, and an organic light-emitting display device including the same.

It should be noted that objects of the present disclosure are not limited to the above-described objects, and other objects of the present disclosure will be apparent to those skilled in the art from the following descriptions.

According to one or more embodiments of the present disclosure, there is provided an organic light-emitting diode including: a first electrode; a first light emitting structure disposed on the first electrode and including a first organic emissive layer; a second light emitting structure disposed on the first light emitting structure and including a second organic emissive layer; a third light emitting structure disposed on the second light emitting structure and including a third organic emissive layer; and a second electrode on the third light emitting structure, wherein a full width at half maximum (FWHM) of a peak wavelength of light emitted from each of the first organic emissive layer and the third organic emissive layer is within a range from 26 nm to 36 nm, inclusive. Accordingly, the blue color coordinate By can be improved while maintaining the efficiency of the organic light-emitting diode.

According to another embodiment of the present disclosure, there is provided an organic light-emitting display device including: a substrate; an overcoat layer disposed on the substrate and including a plurality of concave portions; and an organic light-emitting diode disposed on the overcoat layer and overlapped with the plurality of concave portions, wherein the organic light-emitting diode includes a first light emitting structure, a second light emitting structure on the first light emitting structure, and a third light emitting structure on the second light emitting structure, and wherein a full width at half maximum (FWHM) of a blue peak wavelength in a photoluminescence (PL) spectrum of light emitted from the organic light-emitting diode is within a range from 26 nm to 36 nm, inclusive. Accordingly, the blue color coordinate By can be decreased, so that it is possible to avoid that the lifetime of blue color is shortened when a white image is displayed.

In another embodiment, the present disclosure provides an organic light-emitting display device that includes a substrate and a plurality of sub-pixels on the substrate. Each of the sub-pixels includes a plurality of microlenses formed in respective portions of an overcoat layer, a first electrode on the plurality of microlenses, a first organic emissive layer on the first electrode, a second organic emissive layer on the first organic emissive layer, a third organic emissive layer on the second organic emissive layer, and a second electrode on the third organic emissive layer. Each of the first organic emissive layer and the third organic emissive layer includes a fluorescent dopant having a doping concentration equal to or less than 4%.

The details of one or more embodiments of the subject matter described in this specification are set forth in the accompanying drawings and the description below.

According to one or more embodiments of the present disclosure, it is possible to improve the efficiency of light extraction and suppress the blue color coordinate from increasing in an organic light-emitting diode having a multi-stack structure that employs the microlens array technology.

According to one or more embodiments of the present disclosure, it is possible to improve the efficiency of light extraction and elongate the lifetime of blue color in an organic light-emitting diode having a multi-stack structure that employs the microlens array technology.

According to one or more embodiments of the present disclosure, it is possible to decrease the blue color coordinate to improve BT.2020 coverage ratio.

It should be noted that effects of the present disclosure are not limited to those described above and other effects of the present disclosure will be apparent to those skilled in the art from the following descriptions.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
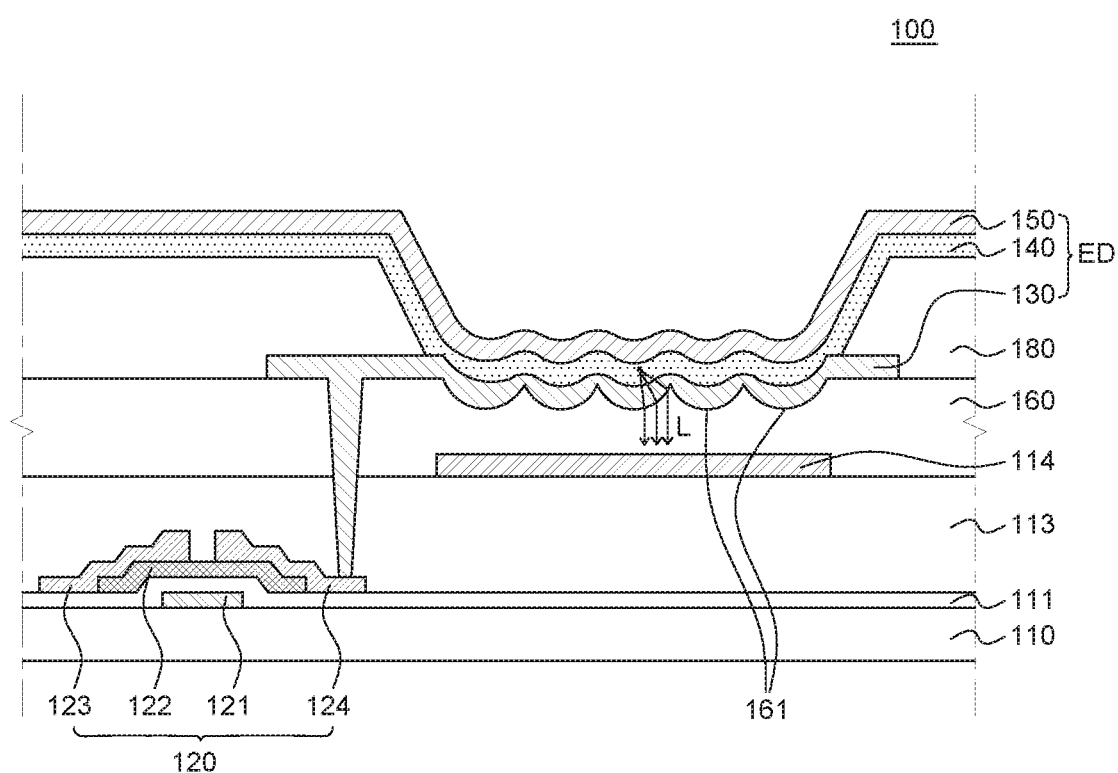
FIG. 1 is a cross-sectional view of an OLED device according to an exemplary embodiment of the present disclosure.

Advantages and features of the present disclosure and methods to achieve them will become apparent from the descriptions of exemplary embodiments hereinbelow with reference to the accompanying drawings. However, the present disclosure is not limited to exemplary embodiments disclosed herein but may be implemented in various different ways. The exemplary embodiments are provided for making the present disclosure thorough and for fully conveying the scope of the present disclosure to those skilled in the art. It is to be noted that the scope of the present disclosure is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions of well-known technologies may be omitted in order not to unnecessarily obscure the gist of the present disclosure. It is to be noticed that the terms "comprising," "having," "including" and so on, used in the description and claims, should not be interpreted as being restricted to the elements or features listed thereafter unless specifically stated otherwise. Where an indefinite or definite article is used when referring to a singular noun, e.g., "a," "an," "the," this includes a plural of that noun unless specifically stated otherwise.

In describing elements, they are interpreted as including error margins even without explicit statements.

In describing positional relationships, such as "an element A on an element B," "an element A above an element B," "an element A below an element B," and "an element A next to an element B," one or more additional elements (e.g., another element C) may be disposed between the elements A and B unless the term "directly" or "immediately" is explicitly used.

As used herein, a phrase "an element A on an element B" means that the element A may be disposed directly on the element B and/or the element A may be disposed indirectly on the element B via another element C.

As used herein, the terms first, second, etc., are used for distinguishing between similar elements and not necessarily for describing a sequential or chronological order. These terms are used to merely distinguish one element from another. Accordingly, as used herein, a first element may be a second element within the technical scope of the present disclosure.

Like reference numerals denote like elements throughout the descriptions.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

FIG. 1 is a cross-sectional view of an OLED device according to an exemplary embodiment of the present disclosure. Referring to FIG. 1, an organic light-emitting display device 100 according to an exemplary embodiment of the present disclosure includes a substrate 110, a thin-film transistor 120, and an organic light-emitting diode (ED). For convenience of illustration, FIG. 1 shows the cross-sectional view of a single sub-pixel of the organic light-emitting display device 100; however, it will be readily understood that the organic light-emitting display device 100 may include any number of sub-pixels having the structure shown in FIG. 1 and arranged, for example, in an array of sub-pixels or any other suitable arrangement. Although the organic light-emitting display device 100 shown in FIG. 1 is a bottom-emission organic light-emitting display, the present disclosure is not limited thereto.

The substrate 110 supports thereon a variety of elements of the organic light-emitting display device 100. The substrate 110 may be made of an insulating material. For example, the substrate 110 may be made of glass or a plastic material such as polyimide (PI).

The thin-film transistor 120 is disposed on the substrate 110. The thin-film transistor 120 includes an active layer 122, a gate electrode 121, a source electrode 123, and a drain electrode 124. The thin-film transistor 120 is a driving thin-film transistor and has a bottom-gate structure in which the gate electrode 121 is disposed under the active layer 122. Although FIG. 1 shows only the driving thin-film transistor among a variety of thin-film transistors that may be included in the organic light-emitting display device 100 (including, for example, in each sub-pixel of the display device 100) for the sake of convenience, it is to be understood that other thin-film transistors such as a switching thin-film transistor may also be included in sub-pixels of the organic light-emitting display device 100. In addition, although the thin-film transistor 120 has a coplanar structure, the thin-film transistor may have other structures such as a staggered structure.

The gate electrode 121 of the thin-film transistor 120 is disposed on the substrate 110. The gate electrode 121 may be formed of, but is not limited to, a conductive metal such as titanium (Ti), copper (Cu), aluminum (Al) and molybdenum (Mo), or an alloy thereof.

A gate insulating layer 111 is disposed over the gate electrode 121. The gate insulating layer 111 insulates the active layer 122 from the gate electrode 121. The gate insulating layer 111 may be made up of a single layer of silicon nitride (SiNx) or silicon oxide (SiOx) which is an inorganic material, or multiple layers of silicon nitride (SiNx) and silicon oxide (SiOx). It is, however, to be understood that the present disclosure is not limited thereto.

The active layer 122 is disposed on the gate insulating layer 111.

The active layer 122 may be made of an amorphous silicon (a-Si), a polycrystalline silicon (poly-Si), an oxide semiconductor, an organic semiconductor, or the like. When the active layer 122 is made of an oxide semiconductor, it may be made of, but is not limited to, indium gallium zinc oxide (IGZO) or the like.

The source electrode 123 and the drain electrode 124 are disposed on the active layer 122. The source electrode 123 and the drain electrode 124 may be made of, but is not limited to, a conductive metal such as titanium (Ti), copper (Cu), aluminum (Al) and molybdenum (Mo), or an alloy thereof. Each of the source electrode 123 and the drain electrode 124 may come in contact with the active layer 122 and accordingly be electrically connected to the active layer 122.

A passivation layer 113 may be disposed over the thin-film transistor 120. The passivation layer 113 is an insulating layer for protecting the thin-film transistor 120. The passivation layer 113 may be made up of a single layer of silicon nitride (SiNx) or silicon oxide (SiOx) which is an inorganic material, or multiple layers of silicon nitride (SiNx) and silicon oxide (SiOx). It is, however, to be understood that the present disclosure is not limited thereto. The passivation layer 113 may include a contact hole through which a first electrode 130 of the organic light-emitting diode ED is connected to the thin-film transistor 120. It is to be noted that the passivation layer 113 may be an optional element in some embodiments, and thus may be eliminated in one or more embodiments depending on the design of the organic light-emitting display device 100. Although the passivation layer 113 is depicted as being flat (e.g., as having a flat upper surface) in FIG. 1 for convenience of illustration, the passivation layer 113 may have a shape conforming to the shapes of elements disposed thereunder.

A color filter layer 114 is disposed on the passivation layer 113. The color filter layer 114 converts the light emitted from a plurality of light emitting structures 140 (which may be referred to herein as a plurality of emitting units 140) to light of a desired color, and the color filter layer 114 may be one of a red color filter, a green color filter, and a blue color filter. When the organic light-emitting display device 100 is a top-emission organic light-emitting display device, the color filter layer 114 may be disposed on the organic light-emitting diode ED. The plurality of emitting units 140 is shown in FIG. 1 as a single layer; however, as will be described in further detail herein (e.g., with respect to FIG. 2), multiple light emitting structures are included in the plurality of emitting units 140, and each of the light emitting structures may be a multi-layer structure.

The color filter layer 114 is formed on the passivation layer 113 in an emission zone of the sub-pixel. Herein, the emission zone refers to an area where the plurality of emitting units 140 emits light by the first electrode 130 and the second electrode 150. More particularly, the emission zone refers to a region where the plurality of emitting units 140 is sandwiched between the first electrode 130 and the second electrode 150, and the plurality of emitting units 140 emits light in response to electrical signals being applied to one or both of the first and second electrodes 130, 150. The formation position and the size of the color filter layer 114 overlapping the emission zone may be determined based on a variety of factors such as the distance between the color filter layer 114 and the first electrode 130, the distance between the color filter layer 114 and the concave portions of the overcoat layer 160 and the distance between the emission zones, as well as the size and position of the emission zone.

The overcoat layer 160 is disposed over the color filter layer 114 and the passivation layer 113. The overcoat layer 160 may be formed of, but is not limited to, one or more of an acrylic resin, an epoxy resin, a phenol resin, a polyamide resin, a polyimide resin, an unsaturated polyester resin, a polyphenylene resin, a polyphenylene sulfide resin, benzocyclobutene and photoresist.

The overcoat layer 160 includes a plurality of concave portions 161 formed to overlap with the color filter layer 114. Each of the plurality of concave portions 161 may have a semi-spherical or semi-elliptical shape. The overcoat layer 160 has a substantially flat upper surface except in regions where the plurality of concave portions 161 is formed.

When the plurality of concave portions 161 is formed in the overcoat layer 160 by photolithography or the like, there are portions that are peaky and have a rapidly-changing morphology in the overcoat layer 160, each of which is formed between the concave portions 161, as shown in FIG. 1. That is, the concave portions 161 define peaks where adjacent concave portions 161 are connected to each other. The plurality of emitting units 140 of the organic light-emitting diode ED may be formed by a thermal deposition process or the like which may deteriorate the step coverage of the plurality of emitting units 140. In addition, the plurality of emitting units 140 may have a very small thickness, e.g., on the order of several hundred nanometers. Accordingly, there may be a region where the emissive layer is not formed on the first electrode 130. As a result, a likelihood that the emission zone is discontinuous, e.g., due to the emissive layer being absent in one or more regions between the first electrode 130 and the second electrode 150, as well as a likelihood that the first electrode 130 and the second electrode 150 are electrically shorted together in regions where the emissive layer is absent, may be increased. For this reason, an additional insulating layer (not shown) may be disposed between the first electrode 130 and the overcoat layer 160 to reduce the step difference that may be created by the plurality of concave portions 161.

Hereinafter, the structure of an organic light-emitting diode ED according to an exemplary embodiment of the present disclosure will be described in detail with reference to FIG. 2.

Figure 2:
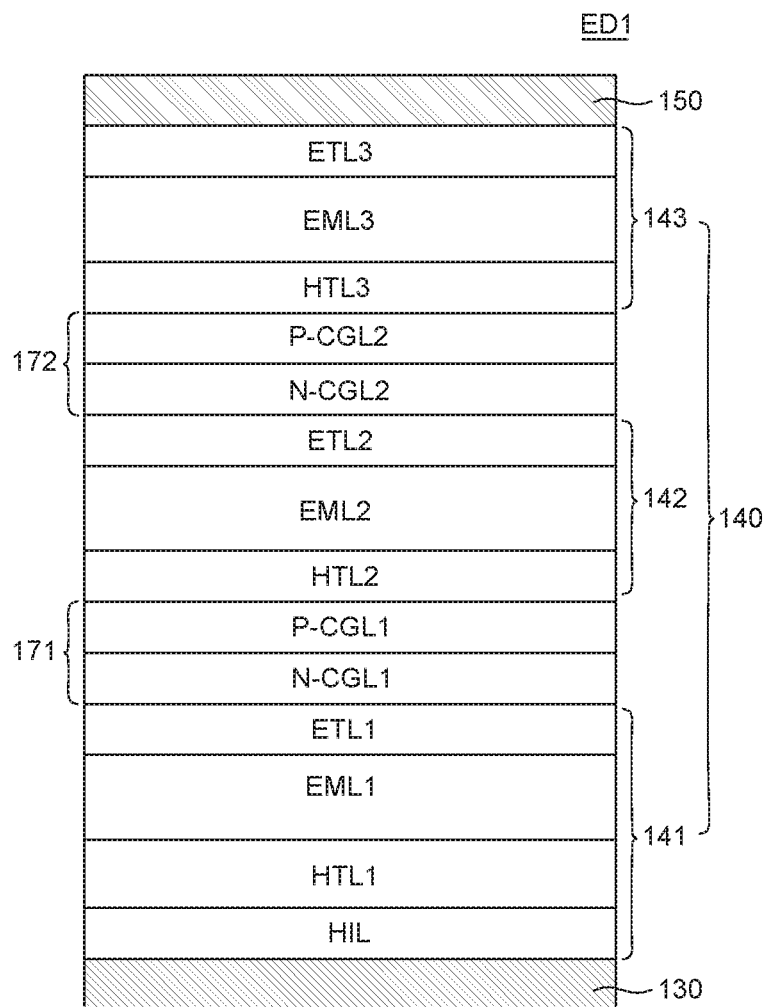
FIG. 2 is a view schematically showing the structure of an organic light-emitting diode according to an exemplary embodiment of the present disclosure.

FIG. 2 is a view schematically showing the structure of an organic light-emitting diode according to an exemplary embodiment of the present disclosure. Referring to FIG. 2, an organic light-emitting diode ED including a first electrode 130, a plurality of emitting units 140 and a second electrode 150, and a bank 180 are disposed on the concave portions of the overcoat layer 160.

As described above, the overcoat layer 160 has a non-flat upper surface in the emission zone. Accordingly, the first electrode 130, the plurality of emitting units including a first light emitting structure 141 (which may be referred to as a first emitting unit 141), a second light emitting structure 142 (which may be referred to as a second emitting unit 142) and a third light emitting structure 143 (which may be referred to as a third emitting unit 143), and the second electrode 150 also have bumpy, undulating, uneven, or otherwise non-flat upper and lower surfaces. This is because the first electrode 130, the first emitting unit 141, the second emitting unit 142, the third emitting unit 143, and the second electrode 150 are formed on the bumpy surface of the overcoat layer 160 (e.g., in the emission zone where the plurality of concave portions 161 are formed), for example, by deposition, and these structures may therefore have surfaces that at least partially correspond to the bumpy surface of the overcoat layer 160.

The first electrode 130 supplies holes to the plurality of emitting units 140. That is to say, the first electrode 130 is an anode that supplies holes to the first emitting unit 141 of the plurality of emitting units 140. The first electrode 130 may be made of a transparent conductive material having a high work function. For example, the first electrode 130 may be made of, but is not limited to, a transparent conductive material such as tin oxide (TO), indium tin oxide (ITO), indium zinc oxide (IZO) and indium zinc tin oxide (IZTO). In some exemplary embodiments of the present disclosure where the organic light-emitting diode ED is employed by a top-emission organic light-emitting display device, a reflective layer made of highly reflective material such as silver (Ag) or a silver alloy may be disposed under the first electrode 130.

The second electrode 150 supplies electrons to the plurality of emitting units 140. That is to say, the second electrode 150 is a cathode that supplies electrons to the third emitting unit 143 of the plurality of emitting units 140. The second electrode 150 may be made of a conductive material having a low work function. In addition, since the organic light-emitting display device 100 is a bottom-emission organic light-emitting display device in the example shown in FIG. 1, the second electrode 150 may be formed of a material having a high reflectivity. For example, the second electrode 150 may be made of at least one selected from the group consisting of conductive metals such as magnesium (Mg), silver (Ag), aluminum (Al) and calcium (Ca), and an alloy thereof. For example, the second electrode 150 may be made of an alloy of magnesium and silver (Mg:Ag). In some exemplary embodiments, when the organic light-emitting diode ED is employed by an a top-emission organic light-emitting display device, the second electrode 150 may be made of a transparent conductive oxide such as indium tin oxide (ITO), indium zinc oxide (IZO) and indium gallium zinc oxide (IGZO), or an alloy of ytterbium (Yb), or the like.

Typically, the refractive index of ITO, in embodiments where ITO is used for the first electrode 130, is approximately 1.7, and the refractive index of the material used for the overcoat layer 160 is approximately 1.5. Therefore, the light emitted from the plurality of emitting units 140 may be totally reflected at the interface between the first electrode 130 and the overcoat layer 160. In this regard, the overcoat layer 160 of the organic light-emitting display device 100 according to an exemplary embodiment of the present disclosure includes the plurality of concave portions 161, so that the overcoat layer 160 forms a microlens array structure. That is, the concave portions 161 of the overcoat layer 160 may define a plurality of microlenses or a microlens array. Therefore, the incidence angle of the light emitted from the plurality of emitting units 140 incident on the interface of the overcoat layer 160 is likely to be smaller than the critical angle of the total reflection, so that the amount of light trapped in the organic light-emitting display device 100 can be reduced. The light emitted from the plurality of emitting units 140 passes through the interface of the overcoat layer 160 and travels at an angle substantially vertical to the lower surface of the substrate 110 (as indicated by L in FIG. 1).

The plurality of emitting units 140 is disposed between the first electrode 130 and the second electrode 150. Each of the plurality of emitting units 140 is a region where light is emitted by the combination of the holes supplied from the first electrode and the electrons supplied from the second electrode 150.

In the organic light-emitting display device 100 according to an exemplary embodiment of the present disclosure, the plurality of emitting units 140 has non-flat upper and lower surfaces and thus has a larger emission zone than that of a plurality of emitting units having flat upper surface and lower surfaces. For example, due to the undulations at the upper and lower surfaces of the plurality of emitting units 140, a larger amount of emissive materials making up the plurality of emitting units 140 may be included in an emission zone having a same width. Therefore, the voltage and current required for emitting light of a given brightness can be reduced, the power can also be reduced, and the lifetime of the organic light-emitting diode ED can be increased.

The plurality of emitting units 140 includes a first emitting unit 141, a second emitting unit 142, and a third emitting unit 143. The plurality of emitting units 140 may be formed in a tandem white architecture in which organic emissive layers EML1, EML2 and EML3 are stacked to emit white light. More particularly, the organic emissive layers EML1, EML2, and EML3 may each emit different colors of light; however, in combination, the multi-layer structure emits white light.

Charge generating layers 171 and 172 are disposed between adjacent ones of the emitting units, so that the plurality of emitting units 140 can receive charges from the charge generating layers 171 and 172. Specifically, a first charge generating layer 171 is disposed between the first emitting unit 141 and the second emitting unit 142, and a second charge generating layer 172 is disposed between the second emitting unit 142 and the third emitting unit 143. The first emitting unit 141, the second emitting unit 142, and the third emitting unit 143 may receive charges from the first charge generating layer 171 and the second charge generating layer 172.

The light emitted from each of the plurality of emitting units 140 may be mixed together to represent the light finally emitted from the plurality of emitting units 140. Therefore, the design of the plurality of emitting units 140 may be altered depending on the color of light to be represented.

The first emitting unit 141 includes a hole injection layer HIL disposed on the first electrode 130, a first hole transport layer HTL1, a first organic emissive layer EML1, and a first electron transport layer ETL1. If the thickness of the first emitting unit 141 is too large, the driving voltage may be increased and the lifetime of the first emitting unit 141 may be shortened. Accordingly, the thickness of the first emitting unit 141 may be equal to or less than 300 Å.

The hole injection layer HIL is disposed on the first electrode 130. The hole injection layer HIL is an organic layer that facilitates injection of holes from the first electrode 130 into the first organic emissive layer EML1. The hole injection layer HIL may be made of, but is not limited to, a material including at least one selected from the group consisting of: HAT-CN(dipyrazino[2,3-f:2',3'-h]quinoxaline-2,3,6,7,10.11-hexacarbonitrile), CuPc(phthalocyanine), F4-TCNQ(2,3,5,6-tetrafluoro-7,7,8,8-tetracyano-quinodimethane), and NPD(N,N'-bis(naphthalene-1-yl)-N,N'-bis(phenyl)-2,2'-dimethylbenzidine.

The first hole transport layer HTL1 is disposed on the hole injection layer HIL. The first hole transport layer HTL1 is an organic layer that facilitates transfer of holes from the hole injection layer HIL to the first organic emissive layer EML1. The first hole transport layer HTL1 and the second hole transport layer HTL2 may be made of, but is not limited to, a material including at least one selected from the group consisting of: NPD(N,N'-bis(naphthalene-1-yl)-N,N'-bis (phenyl)-2,2'-dimethylbenzidine), TPD(N,N'-bis-(3-methylphenyl)-N,N'-bis(phenyl)-benzidine), s-TAD(2,2',7,7'-tetrakis(N,N-dimethylamino)-9,9-spirofluorene) and MTDATA(4,4',4"-Tris(N-3-methylphenyl-N-phenyl-amino)-triphenylamine).

The first hole transport layer HTL1 may work as an electron blocking layer (EBL). The electron blocking layer is an organic layer that suppresses electrons injected into the first organic emissive layer EML1 from overflowing to the first hole transport layer HTL1. The electron blocking layer can improve the bonding of holes and electrons in the first organic emissive layer EML1 by suppressing the movement of electrons and can improve the luminous efficiency of the first organic emissive layer EML1. It is to be understood that the electron blocking layer may be disposed as a separate layer from the first hole transport layer HTL1.

In the first organic emissive layer EML1, the holes supplied from the first electrode 130 and the electrons supplied from the second electrode 150 are recombined, so that excitons are generated. The region where the excitons are generated may be referred to as an emission zone, or a recombination zone.

The first organic emissive layer EML1 is disposed between the first hole transport layer HTL1 and the first electron transport layer ETL1. Specifically, the first organic emissive layer EML1 may be disposed at a position spaced apart from the second electrode 150 by a distance in a range from 4,000 Å to 4,300 Å in order to increase the luminous efficiency. The first organic emissive layer EML1 is a fluorescent emissive layer, is disposed at a position of the first emitting unit 141 where excitons are formed, and includes a material that emits light of a particular color. In some embodiments, the first emissive layer EML1 includes a material capable of emitting blue light.

The first organic emissive layer EML1 may have a host-dopant system, in which a light-emitting dopant material is doped into a host material occupying a large weight ratio so that the light-emitting dopant material has a small weight ratio.

The first organic emissive layer EML1 includes an electron-type host and a hole-type host. The ratio between the electron-type host and the hole-type host may be within a range from 7:3 to 8:2 for improving the lifetime. It is to be understood that the first organic emissive layer EML1 may include a single host material.

The first organic emissive layer EML1 comprising a plurality of host materials or a single host material may be doped with a blue fluorescent dopant material. The dopant material may be a material that allows the full width at half maximum (FWHM) of the peak wavelength of the light emitted from the first organic emissive layer EML1 to be within a range from 26 nm to 36 nm, inclusive. That is to say, the FWHM of the peak wavelength of the light emitted from the first organic emissive layer EML1 may be determined by the dopant included in each of the first emitting unit 141 and the third emitting unit 143. The FWHM of the wavelength of the light emitted from the first organic emissive layer EML1 will be described in more detail later together with the third emissive layer EML3.

The first emitting unit 141 may be implemented as a host-dopant system, such that the emission zone can be determined based on the dopant concentration. For fluorescent emission, if the doping concentration of the dopant is increased, the excitons may meet the holes to result in the quenching of excitons, i.e., no emission occurs. As a result, the luminous efficiency may be lowered. For this reason, the doping concentration of the dopant in the first emissive layer EML1 of the first emitting unit 141 may be equal to or less than 4%.

The blue fluorescent dopant material may be made of, but is not limited to, a material including at least one selected from the group consisting of: a pyrene series substituted with an arylamine-based compound, (4,6-F2ppy)2Irpic, FIrPic(bis(3,5-difluoro-2-(2-pyridyl)phenyl-(2-carboxypyridyl) iridium), an iridium (Ir) ligand complex comprising Ir(ppy)3(factris(2-phenylpyridine)iridium)(tris(2-phenylpyridine)iridium), spiro-DPVBi, spiro-6P, spiro-BDAVBi(2,7-bis[4-(diphenylamino)styryl]-9,9'-spirofluorene), distyrylbenzene (DSB), distyrylarylene (DSA), PFO-based polymer, and PPV-based polymer.

The first electron transport layer ETL1 may be disposed on the first organic emissive layer EML1. The first electron transport layer ETL1 receives electrons from a first n-type charge generating layer N-CGL1 to be described below. The first electron transport layer ETL1 transfers the received electrons to the first organic emissive layer EML1.

In addition, the first electron transport layer ETL1 may work as a hole blocking layer HBL. The hole blocking layer can suppress the holes that have not participated in recombination in the first organic emissive layer EML1 from leaking. The hole blocking layer HBL may be included as part of the first electron transport layer ETL1, or in some embodiments it may be in a separate layer.

The first electron transport layer ETL1 may be made of, but is not limited to, at least one selected from the group consisting of: Liq(8-hydroxyquinolinolato-lithium), PBD(2-(4-biphenyl)-5-(4-tert-butylphenyl)-1,3,4-oxadiazole), TAZ (3-(4-biphenyl)4-phenyl-5-tert-butylphenyl-1,2,4-triazole), BCP(2,9-Dimethyl-4,7-diphenyl-1,10-phenanthroline) and BAlq(bis(2-methyl-8-quinolinolate)-4-(phenylphenolato) aluminium). In some embodiments, the electron transport layer ETL1 may be an optional layer which may be eliminated depending on the structure and characteristics of the organic light-emitting display device 100.

The first charge generating layer 171 is disposed between the first emitting unit 141 and the second emitting unit 142. The first charge generating layer 171 supplies charges to the first emitting unit 141 and the second emitting unit 142 to adjust the charge balance in the first emitting unit 141 and the second emitting unit 142.

The first charge generating layer 171 includes a first n-type charge generating layer N-CGL1 and a first p-type charge generating layer P-CGL1. The first n-type charge generating layer N-CGL1 is disposed on the first electron transport layer ETL1. The first p-type charge generating layer P-CGL1 is disposed between the first n-type charge generating layer N-CGL1 and the second hole transport layer HTL2. The first charge generating layer 171 may be made up of a plurality of layers including the first n-type charge generating layer N-CGL1 and the first p-type charge generating layer P-CGL1, but the present disclosure is not limited thereto. In some embodiments, the first charge generating layer 171 may be made up of a single layer.

The first n-type charge generating layer N-CGL1 injects electrons into the first emitting unit 141. The first n-type charge generating layer N-CGL1 may include an n-type dopant material and an n-type host material. The n-type dopant material may be one or more metals in Groups I and II in the Periodic Table, an organic material to which electrons can be injected, or a mixture thereof. For example, the n-type dopant material may be an alkali metal or alkali earth metal. That is, the first n-type charge generating layer N-CGL1 may be formed as, but is not limited to, an organic layer doped with an alkali metal such as lithium (Li), sodium (Na), potassium (K) and cesium (Cs), or an alkali earth metal such as magnesium (Mg), strontium (Sr), barium (Ba) and radium (Ra). For example, the n-type host material may be made of, but is not limited to, a material capable of delivering electrons, e.g., at least one selected from the group consisting of: Alq3(tris(8-hydroxyquinolino)aluminum), Liq(8-hydroxyquinolinolato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi(2,2',2-(1,3,5-benzinetriyl)-tris(1-phenyl-1-H-benzimidazole).

The first p-type charge generating layer P-CGL1 injects holes into the second emitting unit 142. The first p-type charge generating layer P-CGL1 may include a p-type dopant material and a p-type host material. The p-type dopant material may be made of, but is not limited to, a metal oxide, an organic material such as tetra(fluoro)-tetra (cyano) quinodimethane (F4-TCNQ), HAT-CN (Hexaazatriphenylene-hexacarbonitrile) and hexaazatriphenylene, or a metal material such as $V_2O_5$, MoOx and $WO_3$. The p-type host material may be made of a material capable of delivering holes including, but not limited to, at least one of NPD(N,N-dinaphthyl-N,N'-diphenyl benzidine)(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine) and MTDATA(4,4',4-Tris(N-3-methylphenyl-N-phenyl-amino)-triphenylamine).

The second emitting unit 142 is disposed on the first charge generating layer 171. The second emitting unit 142 includes a second hole transport layer HTL2, a second organic emissive layer EML2, and a second electron transport layer ETL2.

The second hole transport layer HTL2 is disposed on the first p-type charge generating layer P-CGL1 of the first charge generating layer 171. The second hole transport layer HTL2 is an organic layer that facilitates transfer of holes from the first p-type charge generating layer P-CGL1 to the second organic emissive layer EML2. The second hole transport layer HTL2 is substantially identical to the first hole transport layer HTL1 of the first emitting unit 141 described above; and, therefore, the redundant description will be omitted.

The second electron transport layer ETL2 is disposed on the second organic emissive layer EML2. The second electron transport layer ETL2 receives electrons from a second n-type charge generating layer N-CGL2 to be described below. The second electron transport layer ETL2 transfers the received electrons to the second organic emissive layer EML2. The second electron transport layer ETL2 is substantially identical to the first electron transport layer ETL1 of the first emitting unit 141 described above; and, therefore, the redundant description will be omitted.

The second organic emissive layer EML2 is disposed between the second hole transport layer HTL2 and the second electron transport layer ETL2. The second organic emissive layer EML2 is a phosphorescent emissive layer, is disposed at a position of the second emitting unit 142 where excitons are formed, and includes a material that emits light of a particular color. In some embodiments, the second organic emissive layer EML2 includes a material capable of emitting red light and may also include a material capable of emitting yellow-green light. Alternatively, the second organic emissive layer EML2 may have a structure in which a red emissive layer that emits red light and a yellow-green emissive layer that emits yellow-green light are stacked.

Like the first organic emissive layer EML1, the second organic emissive layer EML2 may include a hole-type host and an electron-type host.

In addition, the second organic emissive layer EML2 may include two or more hosts and at least one dopant.

The second charge generating layer 172 is disposed between the second emitting unit 142 and the third emitting unit 143. The second charge generating layer 172 includes a second n-type charge generating layer N-CGL2 and a second p-type charge generating layer P-CGL2. The second n-type charge generating layer N-CGL2 is disposed on the second electron transport layer ETL2. The second p-type charge generating layer P-CGL2 is disposed between the second n-type charge generating layer N-CGL2 and the third hole transport layer HTL3. It is to be noted that the second charge generating layer 172 is substantially identical to the first charge generating layer 171 described above except for the location; and, therefore, the redundant description will be omitted.

The third emitting unit 143 is disposed on the second charge generating layer 172. The third emitting unit 143 includes a third hole transport layer HTL3, a third organic emissive layer EML3, and a third electron transport layer ETL3. Since the third emitting unit 143 is a fluorescent emissive layer, the third emitting unit 143 may be defined as a fluorescent emitting unit.

It may be advantageous that the thickness of the third emitting unit 143 is equal to or less than 250 Å. If the thickness of the third emitting unit 143 is too large, the intensity of light emitted from the second emitting unit 142 may be too strong, such that white color coordinates of the organic light-emitting diode ED may be distorted. Further, as the luminous efficiency of the first and third emitting units 141 and 143, which are blue fluorescent emitting units, become lower earlier, the lifetime of the organic light-emitting diode ED may be shorted. In addition, if the thickness of the third emitting unit 143 is large, the overall thickness of the organic light-emitting diode ED becomes large, such that the driving voltage may rise. Therefore, the thickness of the third emitting unit 143 may be 250 Å or less.

The third hole transport layer HTL3 is disposed on the second p-type charge generating layer P-CGL2 of the second charge generating layer 172. The third hole transport layer HTL3 is an organic layer that facilitates transfer of holes from the second p-type charge generating layer P-CGL2 to the third organic emissive layer EML3. The third hole transport layer HTL3 is substantially identical to the first hole transport layer HTL1 of the first emitting unit 141 and the second hole transport layer HTL2 described above; and, therefore, the redundant description will be omitted.

The third organic emissive layer EML3 is disposed between the third hole transport layer HTL3 and the third electron transport layer ETL3. The third organic emissive layer EML3 is disposed at a position of the third emitting unit 143 where excitons are formed, and includes a material that emits light of a particular color. The third emissive layer EML3 may include a material capable of emitting blue light. Specifically, the third organic emissive layer EML3 may be disposed at a position spaced apart from the second electrode 150 by a distance in a range from 460 Å to 600 Å in order to increase the luminous efficiency.

The third organic emissive layer EML3 is implemented as a host-dopant system and may be substantially the same as or identical to the first organic emissive layer EML1 described above.

That is to say, the third organic emissive layer EML3 includes an electron-type host and a hole-type host. The ratio between the electron-type host and the hole-type host may be 7:3 to 8:2 for improving the lifetime. It is to be understood that the third organic emissive layer EML3 may include a single host material.

The third organic emissive layer EML3 comprising a plurality of host materials or a single host material is doped with a blue fluorescent dopant material. The dopant material may be a material that allows the full width at half maximum (FWHM) of the peak wavelength of the light emitted from the third organic emissive layer EML3 to be within a range of 26 nm to 36 nm, inclusive.

The first emitting unit 141 and the third emitting unit 143, which are fluorescent emitting units, may be implemented as a host-dopant system, such that the emission zone can be determined based on the dopant concentration. For fluorescent emission, if the doping concentration of the dopant is increased, the excitons may meet the holes to result in the quenching of excitons, i.e., no emission occurs. As a result, the luminous efficiency may be lowered. When the doping concentration is 4%, the efficiency has the maximum value. When the doping concentration is greater than 4%, the efficiency may be lowered and the lifetime may be shortened. Therefore, it may be effective that the doping concentration of the fluorescent dopant in the first emitting unit 141 and the third emitting unit 143 is equal to or less than 4%.

The third electron transport layer ETL3 is disposed on the third organic emissive layer EML3. The third electron transport layer ETL3 transfers the received electrons to the third organic emissive layer EML3. The third electron transport layer ETL3 is substantially identical to the first electron transport layer ETL1 of the first emitting unit 141 described above; and, therefore, the redundant description will be omitted.

The organic light-emitting diode ED according to an exemplary embodiment of the present disclosure has a three-stack architecture in which the first emitting unit 141, the second emitting unit 142 and the third emitting unit 143 are stacked on one another. In addition, the first emitting unit 141 and the third emitting unit 143 are the fluorescent emitting units to emit blue light, while the second emitting unit 142 is the phosphorescent emitting unit to emit red light and yellow-green light. Accordingly, the organic light-emitting diode ED according to an exemplary embodiment of the present disclosure may be an organic light-emitting diode that emits white light.

Incidentally, the emission zone of each organic emissive layer may vary depending on the current density. For example, as the current density decreases, the emission zone may be reduced rapidly. The emission zone of each organic emissive layer may be determined depending on the concentration of the dopant doped in the organic emissive layer. When the concentration of the dopant is optimized, the emission zone of the organic emissive layer can be distributed widely, so that the emission zone may be reduced less even if the current density decreases. As a result, when the dopant concentration is optimized, the efficiency of the organic light-emitting diode ED can be constant over a wide range of current density, i.e., a wide range of driving voltage.

Therefore, it is possible to reduce the decrease in the emission zone by optimizing the concentration of the dopant of the first organic emissive layer EML1, which is the center of the emission zone of the first emitting unit 141, and the third organic emissive layer EML3, which is the center of the emission zone of the third emitting unit 143. As described above, it may be effective that the dopant concentration of the first organic emissive layer EML1 and the dopant concentration of the third organic emissive layer EML3 are equal to or less than 4%.

Hereinafter, the tendency of the change in brightness versus peak wavelength of an organic light-emitting diode that does not employ a blue dopant for adjusting the FWHM of the light emitted from the first organic emissive layer EML1 and the third organic emissive layer EML3 will be described.

Figure 3:
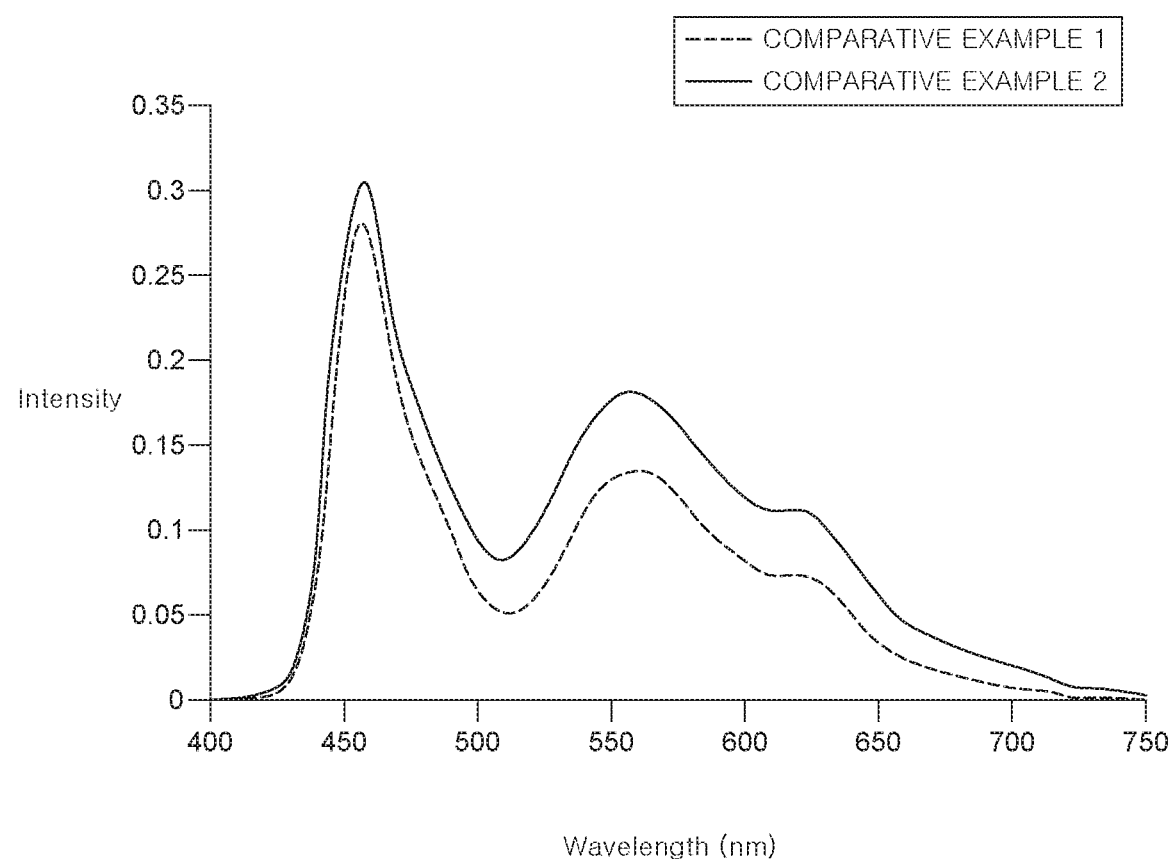
FIG. 3 is a graph showing change in brightness versus wavelength according to Comparative Example 1 and Comparative Example 2.

FIG. 3 is a graph showing change in brightness versus wavelength according to Comparative Example 1 and Comparative Example 2. Specifically, in FIG. 3, the horizontal axis represents wavelength in nm and the vertical axis represents intensity.

Specifically, the graph shows a curve representing change in brightness versus wavelength for Comparative Example 2, in which no blue dopant is used for adjusting the FWHM of the peak wavelength of the light emitted from the first organic emissive layer EML1 and the second organic emissive layer EML2 in the display device 100 according to the above-described exemplary embodiment of the present disclosure. The graph shows a curve representing change in brightness versus wavelength for Comparative Example 1, in which the microlens array technology in Comparative Example 2 is not employed.

Comparing Comparative Example with Comparative Example 2 with reference to FIG. 3, by applying the microlens array technology to the organic light-emitting diode of Comparative Example 1, the efficiency of light extraction is increased in the organic light-emitting diode of Comparative Example 2, so that the brightness can be increased over almost all the wavelength ranges. That is, as shown in FIG. 3, the intensity of light emitted in Comparative Example 2, which includes the microlens array, is greater across substantially the entire range of wavelengths than the intensity of light emitted in Comparative Example 2, which does not include the microlens array.

However, there may arise a problem that shoulder peaks are increased in the wavelength range of approximately 450 nm to 550 nm between the blue wavelength and the green wavelength. As a result, the blue emission peak is shifted to a longer wavelength, such that the blue color coordinate By increases. Thus, the blue lifetime decreases due to the increase of the blue color coordinate By, and the BT.2020 coverage ratio may decrease.

In view of the above, in the organic light-emitting display device 100 according to an exemplary embodiment of the present disclosure, a dopant is used to adjust the FWHM of a peak wavelength of light emitted from the first organic emissive layer EML1 and the third organic emissive layer EML3. This will be described in more detail with reference to FIG. 4.

Figure 4:
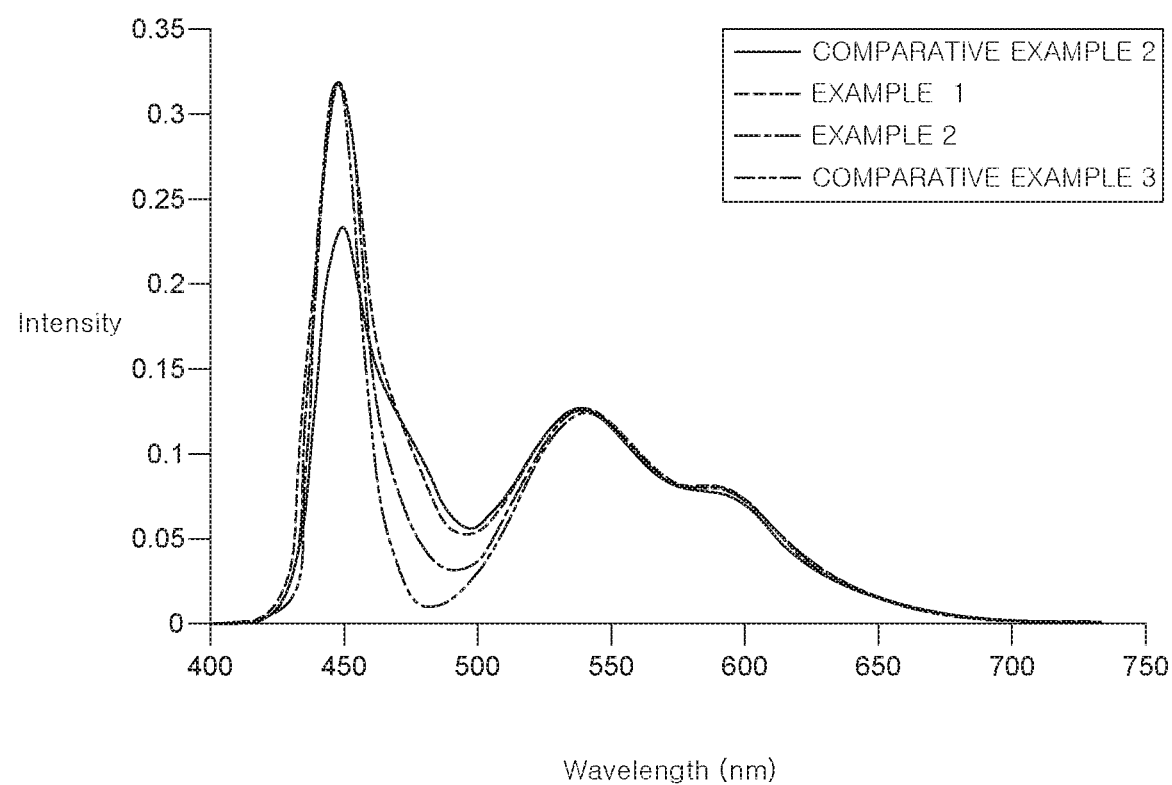
FIG. 4 is a graph showing change in brightness versus wavelength in Comparative Examples 2 and 3 and Examples 1 and 2.

FIG. 4 is a graph showing change in brightness versus wavelength in Comparative Examples 2 and 3 and Examples 1 and 2. In FIG. 4, the horizontal axis represents peak wavelength in nm and the vertical axis represents intensity.

Specifically, the graph shows a curve representing change in brightness versus wavelength for Comparative Example 3, in which a blue dopant is used for setting the FWHM of the peak wavelength of the light emitted from the first organic emissive layer EML1 and the third organic emissive layer EML3 to 22 nm in the display device 100 according to the above-described exemplary embodiment of the present disclosure. The graph shows a curve representing change in brightness versus wavelength for Example 1, in which a blue dopant is used for setting the FWHM of the peak wavelength of the light emitted from the first organic emissive layer EML1 and the third organic emissive layer EML3 to 36 nm in the display device 100 according to the above-described exemplary embodiment of the present disclosure. In addition, the graph shows a curve representing change in brightness versus wavelength for Example 2, in which a blue dopant is used for setting the FWHM of the peak wavelength of the light emitted from the first organic emissive layer EML1 and the third organic emissive layer EML3 to 26 nm in the display device 100 according to the above-described exemplary embodiment of the present disclosure.

Table 1 shows the luminous efficiency in cd/A and the blue color coordinates (Bx, By) measured from the organic light-emitting diodes fabricated according to Examples 1 and 2, and Comparative Examples 2 and 3 after the color filter has been disposed therein.

TABLE 1

|  |  | C. Exemple 2 | Exemple 1 | Exemple 2 | C. Exemple 3 |
|---|---|---|---|---|---|
| Efficiency (cd/A) | R | 10.4 | 10.5 | 10.5 | 10.5 |
|  | G | 30.0 | 28.9 | 26.2 | 24.7 |
|  | B | 4.3 | 4.7 | 3.8 | 2.9 |
|  | W | 94.5 | 93.4 | 87.6 | 83.7 |
| Color Coordinate | Bx | 0.142 | 0.144 | 0.147 | 0.150 |
|  | By | 0.050 | 0.043 | 0.037 | 0.032 |
| BT2020_Area |  | 77.5 | 80.1 | 82.2 | 84.6 |
| BT2020_Coverage |  | 77.5 | 78.9 | 79.3 | 78.4 |
| B FWHM |  | 51 | 36 | 26 | 22 |

As can be seen from Table 1, in the organic light-emitting display device according to Comparative Example 2 fabricated by applying the microlens array element to the organic light-emitting display device according to Comparative Example 1 of FIG. 3, the efficiency of white (W) was increased while the color coordinates By of blue was increased.

In contrast, according to Comparative Example 3 in which a blue dopant was applied so that the FWHM is further lowered than that of Comparative Example 2, i.e., to 22 nm, the blue color coordinate By decreased while the BT.2020 area was increased to improve the BT.2020 coverage ratio. However, it can be seen that not only the efficiency of white but also the efficiency of blue were decreased. In particular, it can be seen that the efficiency of blue was rapidly reduced to 2.9.

In addition, as can be seen from Table 1, according to Example 1 in which a blue dopant was applied to Comparative Example 2 so that the FWHM became 36 nm, the blue color coordinate By was decreased while an increment in the efficiency of each color of light was maintained. In addition, it can be seen that the BT.2020 area was increased in Example 1 as compared with Comparative Example 2, so that the BT.2020 coverage ratio was improved.

In addition, according to Example 2 in which a blue dopant was applied to Comparative Example 2 so that FWHM became 26 nm, the blue color coordinate By was decreased and the BT.2020 area is increased so that BT.2020 coverage ratio was improved, compared to Example 1.

Embodiments of the present disclosure can also be described as follows:

According to one embodiment of the present disclosure, there is provided an organic light-emitting diode including: a first electrode; a first emitting unit disposed on the first electrode and comprising a first organic emissive layer; a second emitting unit disposed on the first emitting unit and comprising a second organic emissive layer; a third emitting unit disposed on the second emitting unit and comprising a third organic emissive layer; and a second electrode on the third emitting unit, wherein a full width at half maximum (FWHM) of a peak wavelength of light emitted from each of the first organic emissive layer and the third organic emissive layer ranges from 26 nm to 36 nm.

Each of the first electrode, the first emitting unit, the second emitting unit, the third emitting unit and the second electrode may have a bumpy shape.

The first organic emissive layer and the third organic emissive layer may be blue emissive layers, and the second organic emissive layer may include a red emissive layer and a yellow-green emissive layer.

The first organic emissive layer and the third organic emissive layer may include at least one of a fluorescent dopant and a phosphorescent dopant that has a FWHM of a peak wavelength of light ranging from 26 nm to 36 nm.

When the first organic emissive layer and the third organic emissive layer include the fluorescent dopant, a doping concentration of the fluorescent dopant in the first organic emissive layer and the third organic emissive layer is equal to or less than 4%.

The first organic emissive layer and the third organic emissive layer may include an electron-type host and a hole-type host, and wherein a ratio of the electron-type host to the hole-type host is 7:3 to 8:2.

A thickness of the first emitting unit may be equal to or less than 300 Å.

A thickness of the third emitting unit may be equal to or less than 250 Å.

A distance between the first organic emissive layer and the second electrode may range from 4,000 to 4,300 Å.

A distance between the third organic emissive layer and the second electrode may range from 460 to 600 Å.

According to another embodiment of the present disclosure, there is provided an organic light-emitting display device including: a substrate; an overcoat layer disposed on the substrate and comprising a plurality of concave portions; and an organic light-emitting diode disposed on the overcoat layer and overlapped with the plurality of concave portions, wherein the organic light-emitting diode comprises a first emitting unit, a second emitting unit on the first emitting unit, and a third emitting unit on the second emitting unit and is configured to emit white light, and wherein a full width at half maximum (FWHM) of a blue peak wavelength in a photoluminescence (PL) spectrum of light emitted from the organic light-emitting diode ranges from 26 nm to 36 nm.

The organic light-emitting display device may further include: a color filter disposed between the substrate and the overcoat layer and overlapped with the plurality of concave portions.

That FWHM of the blue peak wavelength may be determined by a dopant included in each of the first emitting unit and the third emitting unit.

The first emitting unit and the third emitting unit may be configured to emit blue light.

A thickness of the first emitting unit may be equal to or less than 300 Å.

A thickness of the third emitting unit may be equal to or less than 250 Å.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting diode, comprising:
    a first electrode;
    a first light emitting structure disposed on the first electrode and including a first organic emissive layer;
    a second light emitting structure disposed on the first light emitting structure and including a second organic emissive layer;
    a third light emitting structure disposed on the second light emitting structure and including a third organic emissive layer; and
    a second electrode on the third light emitting structure,
    wherein each of the first organic emissive layer and the third organic emissive layer is configured to emit blue light.

2. The organic light-emitting diode of claim 1, wherein each of the first electrode, the first light emitting structure, the second light emitting structure, the third light emitting structure, and the second electrode has a bumpy shape.

3. The organic light-emitting diode of claim 1, wherein the second organic emissive layer has at least one of a red emissive layer and a yellow-green emissive layer, and
    wherein the yellow-green emissive layer is stacked on the red emissive layer.

4. The organic light-emitting diode of claim 1, wherein the first organic emissive layer and the third organic emissive layer are blue emissive layers, and
    wherein the second organic emissive layer includes a red emissive layer and a yellow-green emissive layer.

5. The organic light-emitting diode of claim 4, wherein a full width at half maximum (FWHM) of a peak wavelength of light emitted from each of the first organic emissive layer and the third organic emissive layer is within a range from 26 nm to 36 nm, inclusive, and
    wherein each of the first organic emissive layer and the third organic emissive layer includes at least one of a fluorescent dopant or a phosphorescent dopant that has a FWHM of a peak wavelength of light within a range from 26 nm to 36 nm, inclusive.

6. The organic light-emitting diode of claim 5, wherein each of the first organic emissive layer and the third organic emissive layer includes the fluorescent dopant, and a doping concentration of the fluorescent dopant in the first organic emissive layer and the third organic emissive layer is equal to or less than 4%.

7. The organic light-emitting diode of claim 1, wherein each of the first organic emissive layer and the third organic emissive layer includes an electron-type host and a hole-type host, and
    wherein a ratio of the electron-type host to the hole-type host is within a range from 7:3 to 8:2, inclusive.

8. The organic light-emitting diode of claim 1, wherein a thickness of the first light emitting structure is equal to or less than 300 Å.

9. The organic light-emitting diode of claim 1, wherein a thickness of the third light emitting structure is equal to or less than 250 Å.

10. The organic light-emitting diode of claim 1, wherein a distance between the first organic emissive layer and the second electrode is within a range from 4,000 to 4,300 Å, inclusive.

11. The organic light-emitting diode of claim 1, wherein a distance between the third organic emissive layer and the second electrode is within a range from 460 to 600 Å, inclusive.

12. An organic light-emitting display device comprising:
    a substrate;
    an overcoat layer disposed on the substrate, the overcoat layer having a plurality of concave portions and a plurality of convex portions; and
    an organic light-emitting diode disposed on the overcoat layer,
    wherein the organic light-emitting diode includes a first light emitting structure, a second light emitting structure on the first light emitting structure, and a third light emitting structure on the second light emitting structure, the organic light-emitting diode being configured to emit white light,
    wherein the first light emitting structure and the third light emitting structure emit blue light.

13. The organic light-emitting display device of claim 12, further comprising:
    a color filter disposed between the substrate and the pluralities of concave and convex portions of the overcoat layer.

14. The organic light-emitting display device of claim 12, wherein a full width at half maximum (FWHM) of a blue peak wavelength in a photoluminescence (PL) spectrum of light emitted from the organic light-emitting diode is within a range from 26 nm to 36 nm, inclusive.

15. The organic light-emitting display device of claim 12, wherein the organic light-emitting diode overlaps with the pluralities of concave and convex portions of the overcoat layer.

16. The organic light-emitting display device of claim 12, wherein a thickness of the first light emitting structure is equal to or less than 300 Å.

17. The organic light-emitting display device of claim 12, wherein a thickness of the third light emitting structure is equal to or less than 250 Å.

18. The organic light-emitting display device of claim 12 wherein the first light emitting structure includes a first organic emissive layer, the second light emitting structure includes a second organic emissive layer and the third light emitting structure includes a third organic emissive layer, and
    wherein each of the first organic emissive layer and the third organic emissive layer includes a fluorescent dopant having a doping concentration equal to or less than 4%.

19. The organic light-emitting display device of claim 18, wherein, in use, the first organic emissive layer, the second organic emissive layer, and the third organic emissive layer, in combination, emit white light.

20. The organic light-emitting display device of claim 12, further comprising:
 a plurality of microlenses formed in respective portions of the overcoat layer; and
 a color filter between the substrate and the plurality of microlenses.

\* \* \* \* \*